United States Patent
Jain et al.

[11] Patent Number: 6,133,805
[45] Date of Patent: Oct. 17, 2000

[54] ISOLATION IN MULTI-LAYER STRUCTURES

[75] Inventors: Nitin Jain, Nashua, N.H.; John Stephen Atherton, Somerville, Mass.; Paul John Schwab, Hudson, N.H.; Graham J. H. Wells, Dracut, Mass.

[73] Assignee: The Whitaker Corporation, Wilmington, Del.

[21] Appl. No.: 09/071,568

[22] Filed: May 1, 1998

Related U.S. Application Data

[63] Continuation-in-part of application No. 08/741,443, Oct. 31, 1996.

[51] Int. Cl.$^7$ .................................. H01P 5/00; H01P 3/08
[52] U.S. Cl. ......................................... 333/1; 333/238
[58] Field of Search ................... 333/1, 238, 246

[56] References Cited

U.S. PATENT DOCUMENTS

| | | | |
|---|---|---|---|
| 2,913,686 | 11/1959 | Fubini et al. | 333/238 |
| 2,926,317 | 2/1960 | Blitz | 333/238 |
| 3,093,805 | 6/1963 | Osifchin et al. | 333/1 |
| 3,135,935 | 6/1964 | Engelbrecht | 333/238 |
| 3,895,435 | 7/1975 | Turner et al. | 29/625 |
| 4,080,579 | 3/1978 | Fassett | 333/246 X |
| 4,628,598 | 12/1986 | Taylor | 29/846 |
| 4,845,311 | 7/1989 | Schreiber et al. | 333/1 X |
| 5,057,798 | 10/1991 | Moye et al. | 333/33 |
| 5,164,692 | 11/1992 | Gertel et al. | 333/238 |
| 5,729,183 | 3/1998 | Schuchmann et al. | 333/1 |

FOREIGN PATENT DOCUMENTS

| | | | |
|---|---|---|---|
| 0 318 311 A2 | 5/1989 | European Pat. Off. | H01P 1/04 |
| 0 506 062 A2 | 9/1992 | European Pat. Off. | H05K 1/00 |

OTHER PUBLICATIONS

Jacob Carl Coetzee and John Joubert, Full–Wave Characterization of the Crosstalk Reduction Effect of an Additional Grouned Track Introduced Between Two Printed Circuit Tracks, Jul. 1996, vol., 43, No. 7, pp. 553–558.

Darcy N. Ladd adn George I. Costache, SPICE Simulation Used To Characterize the Cross–Talk Reduction Effect of Additional Tracks Grounded with Vias on Printed Circuit Boards, Jun., 1992, vol., 39, No. 6, pp. 342–348.

Antonije R. Djordjevic, Tapan K. Sarkar, and Roger F. Harrington, Time–Domain Response of Multiconductor Transmission Lines, Jun., 1987, vol., 75, No. 6., pp. 111–131.

*Primary Examiner*—Paul Gensler

[57] ABSTRACT

An apparatus for propagating high frequency energy hag a wavelength of $\lambda$ in a dielectric medium has first and second signal lines, substantially coplanar with each other, and carrying high frequency energy, A ground trace separates the signal lines and has a plurality of vias, each spaced a distance greater than one quarter $\lambda$ and less than one half $\lambda$ apart from another one of the vias.

8 Claims, 8 Drawing Sheets

ISOLATION IN MULTI-LAYER STRUCTURES

RELATED APPLICATION INFORMATION

This application is a continuation-in-part of U.S. patent application Ser. No. 08/741,443, filed on Oct. 31, 1996.

FIELD OF THE INVENTION

The present invention relates to methods of improving isolation between signal lines in multi-layer printed circuit boards.

BACKGROUND OF THE INVENTION

Multi-layer structures are used quite frequently in microwave, rf and other high frequency applications. The structures have a great deal of advantage because of their ability to reduce the overall area of circuit board structure which has clear benefits in the wireless industry where size considerations are of the utmost importance. Additionally, multi-layer boards have been accepted in the industry because of relatively low cost and good performance. However, isolation of neighboring transmission lines remains a great problem in the high frequency multi-layer structure.

Figure 1:
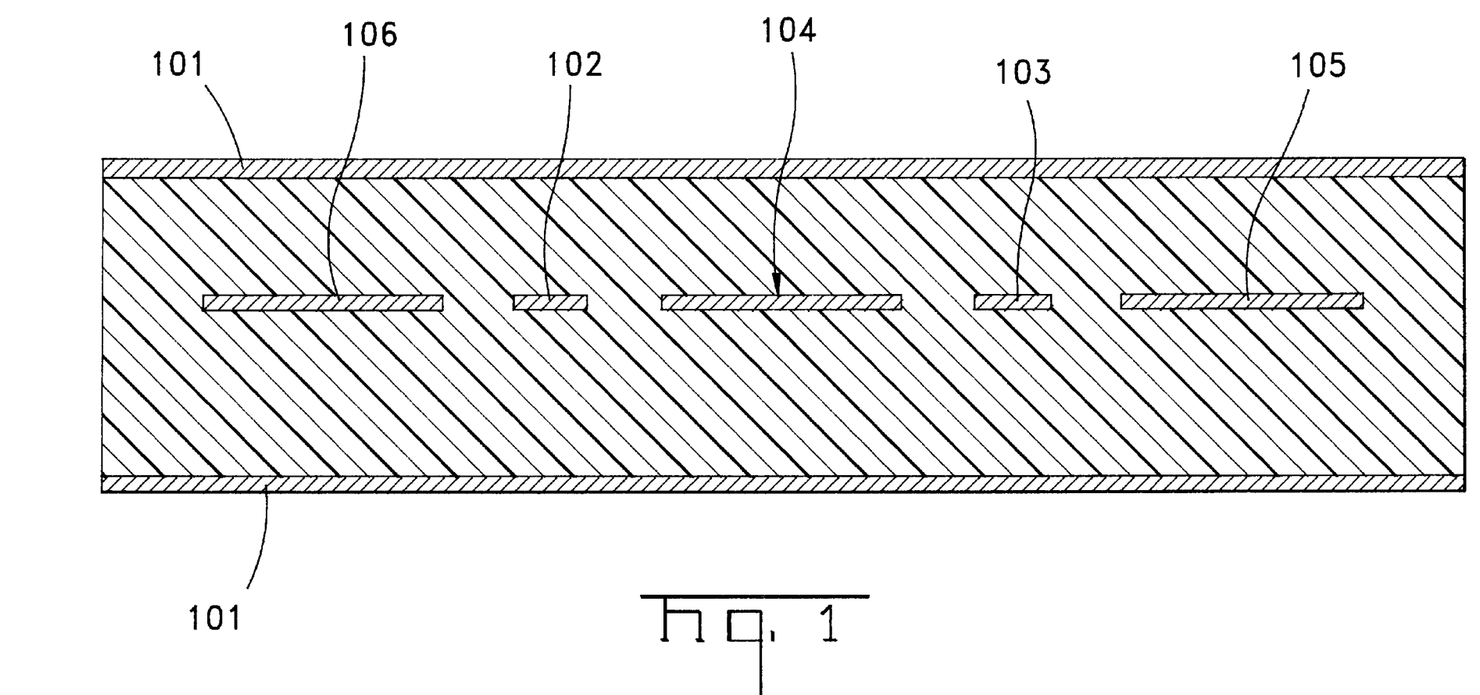
FIG. 1 is a cross-sectional view of a conventional transmission line structure having center grounds and rf signal lines.

A typical multilayer board structure in cross-section is shown in FIG. 1. In this particular structure, a lower and upper ground plane 101 enclose selectively located signal lines 102, 103 and ground layers 104, 105 and 106. This structure has improved isolation characteristics which are desired provided the ground layers 104, 105 and 106 are maintained at a good ground level. Clearly, the isolation between the rf signal lines can be reduced significantly compared to when the ground lines 104, 105 and 106 are floating. To this end, the reduction in isolation can be as great as 65 dB relative to the case when the grounds float. The lines 104, 105, and 106 are therefore connected to ground using metal coated via holes. One approach suggests placement of numerous vias that are small in diameter and are placed as close as possible. Another approach suggests placement of vias with separation less than a quarter wavelength at the frequency of interest. However, this is insufficient to provide adequate isolation and is sometimes counter productive. Additionally the importance of via inductance to isolation degradation is not understood.

Figure 2:
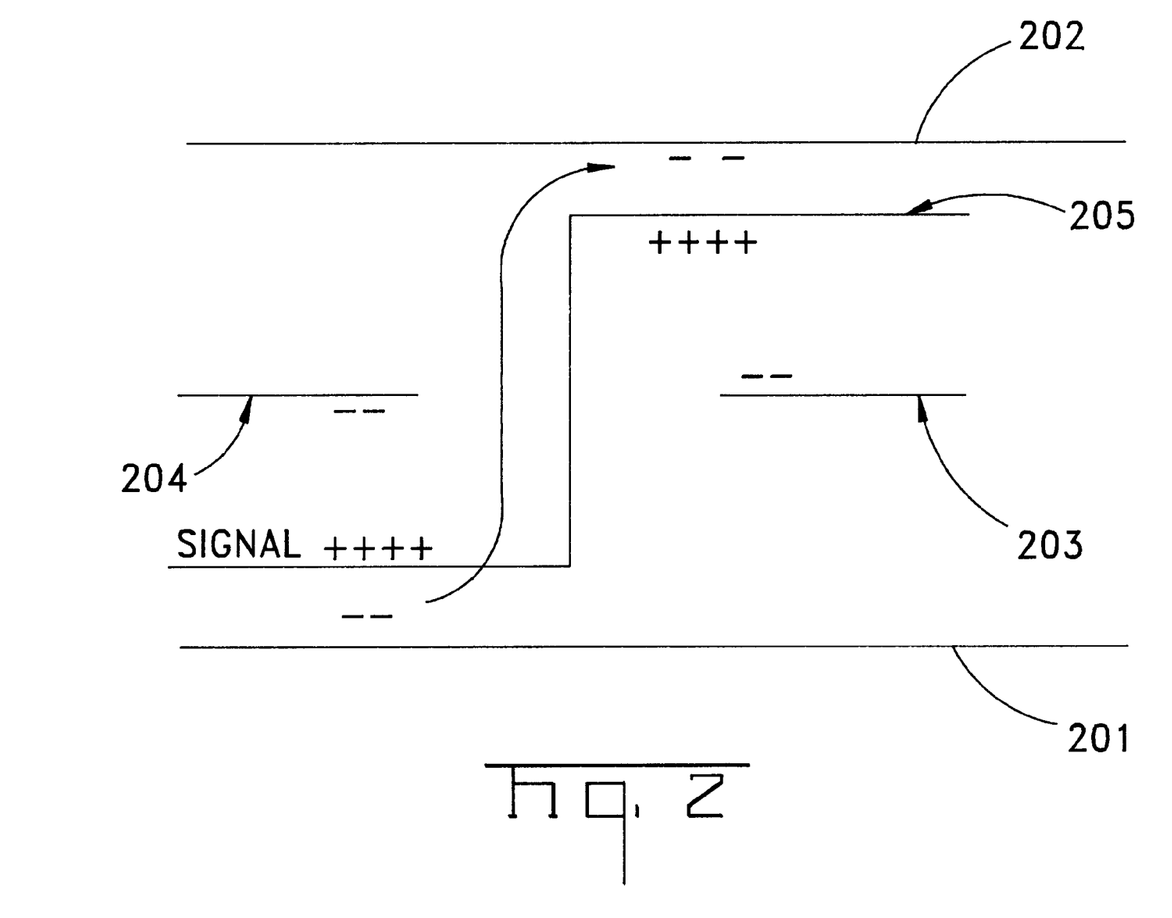
FIG. 2 is a cross-sectional view of a signal line in transition from one level to another with three ground planes.

Additionally, it is often necessary to have signal line transitions between layers of the multi-layer board which can adversely affect the isolation between the signal lines. For example, a typical cross-sectional view of a signal line in a transition between levels is shown in FIG. 2. The uppermost and lowermost ground planes for the transition in FIG. 2 are shown as 202 and 201. Additionally, an intermediate ground plane within the board for purposes of isolation is shown in FIG. 2 as 203 and 204. The signal line 205 makes a transition from one level to another for various and sundry purposes. This transition can be problematic from the standpoint of isolation. In this transition, a neighboring signal line to 205 could readily couple to signal line 205 if the grounding transition between the layers 201, 202, 203 and 204 proves inadequate. Accordingly, it is desired to have a better ground capability at levels 203, 204 in order to effect good isolation between signal line 205 and a neighboring signal line not shown. To be clear, the discontinuities at transitions result in the creation of other modes at the transition which can couple to neighboring signal lines.

As the overall performance of the system is hindered by poor isolation of signals at a transition, it is imperative to have a board which has improved isolation. While vias are used for grounding purposes, there is a need to effect proper grounding. Accordingly, what is desired is an improved isolation scheme in multi-layer rf and other high frequency transmission line circuit boards in which the isolation is maintained at an acceptable level.

SUMMARY OF THE INVENTION

The present invention relates to an improved structure for isolation of transmission lines in a microwave or rf multi-layer structure. The present invention is drawn to a method of the placement of vias as well as their dimensions and geometric shape in order to most effectively reduce the forward and reverse coupling between transmission lines on the same layer or between transmission lines on different layer multilayer structures. As stated above, at the transition points of transition lines in multi-layer structures from one level to another, there is the potential for significant coupling between transmission lines. Accordingly, there is a marked decrease in isolation in most systems. Particularly at transition points, because signal line transitions occur at points of transition between the layers, it is essential that a good ground be incorporated with the signal line at transitions from one level in a multilayer board to another. Otherwise, undesired modes are radiated from the transitioning transmission line to neighboring transmission lines, adversely effecting the isolation of the neighboring line from the transitioning transmission line. This undesired effect is reduced dramatically with a reduction of both forward and reverse coupling by proper placement of ground vias as well as the size and geometric shape. To this end, at a transition, where ground planes for a transmission line are also transitioned, the inductance between the two ground planes at a point of transition should be reduced as greatly as is possible.

The present invention is also drawn to the placement of vias as far apart as possible but less than integral half wavelengths apart at the frequency of operation at non-transition regions. To this end, placing the vias as far apart as possible reduces the likelihood of phase or partial phase induced coupling of signals with signal vectors of nearby signal lines. By placing the vias less than integral half wavelength apart, natural resonance conditions are avoided.

The dimensions of the vias are chosen to reduce the inductance of the individual vias. One approach is to make the vias as large as possible to reduce as greatly as possible the inductance of each individual via. This is found to have a rather dramatic effect and results in improved isolation by reducing the inductance induced coupling between the signal lines associated with the vias. This desired result can be achieved by a variety of techniques, however. To this end, the cross-sectional area as well as the orientation of the via with respect to the transmission line are important parameters to be considered in designing the vias. The greater the cross-sectional area the lower the individual inductance of the via. The orientation also has a dramatic effect on the inductance and inductive coupling. The end result is a system having an isolation on the order of at 60–85 dB.

OBJECTS, FEATURES AND ADVANTAGES

It is an object of the present invention to improve the isolation between transmission lines in a single or a multi-layer high frequency structure.

It is a further feature of the present invention to locate the vias as far apart as possible in the transition region, while avoiding placement of vias at half wavelengths apart.

It is a further feature of the present invention to have at least two ground planes with sections of dielectric separating the ground planes between two signal lines.

It is a further feature of the present invention to have vias with an area great enough to reduce effectively the inductance of the via.

It is an advantage of the present invention to have a simple structure for effecting via placement readily adaptable to high volume manufacturing techniques.

DETAILED DESCRIPTION OF THE INVENTION

Figure 3:
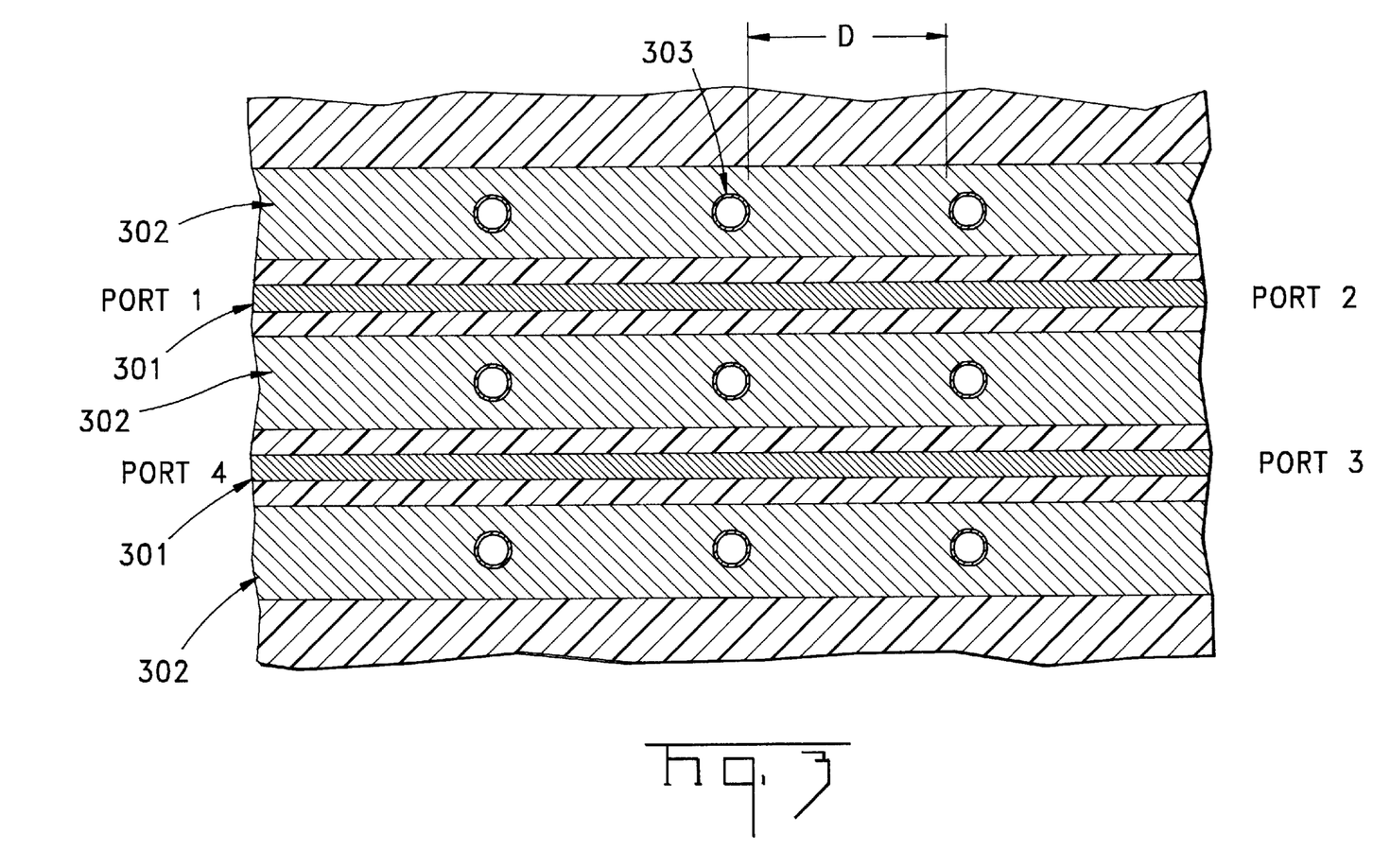
FIG. 3 is a top view of a section of a particular layer of transmission line structure of a multi-layer board.
Figure 4:
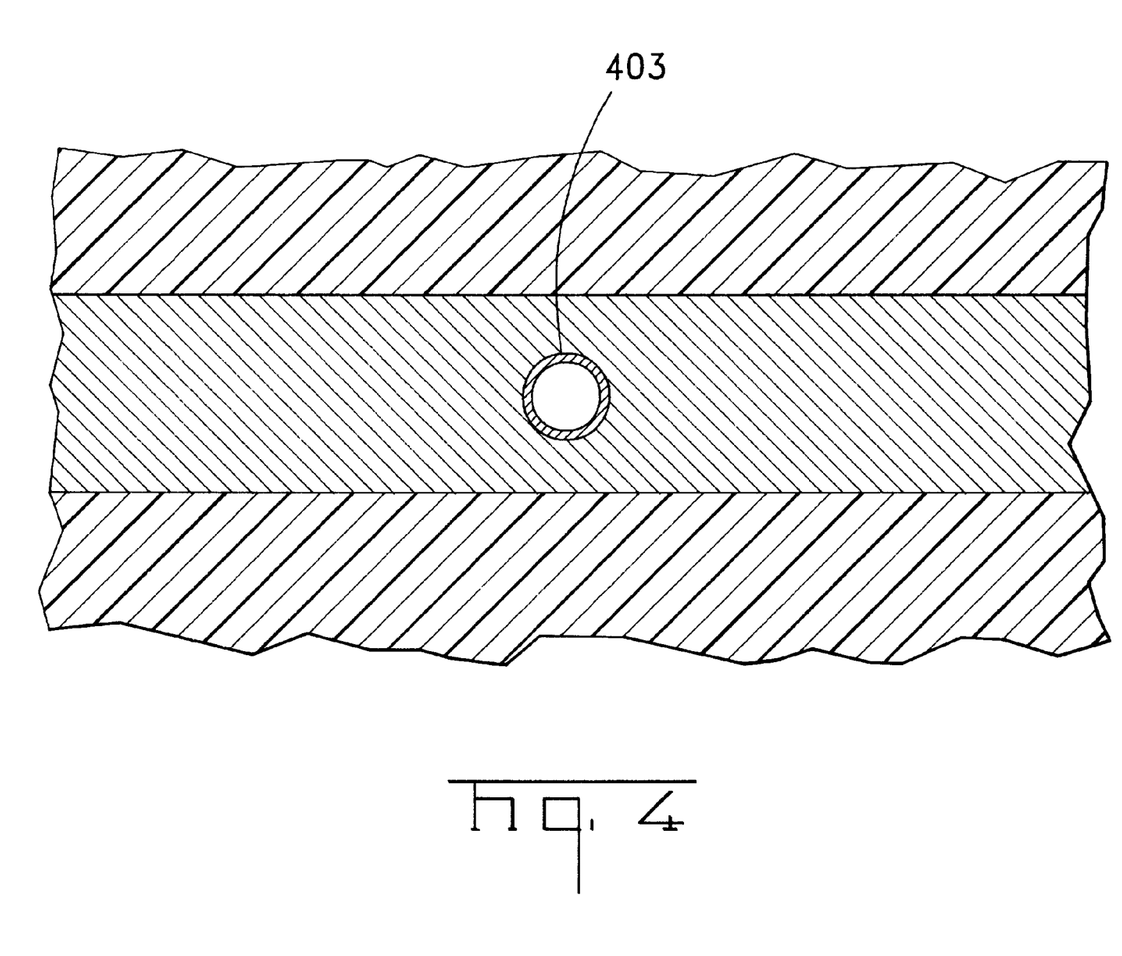
FIG. 4 is an enlarged view of a via on a board at a given level.

Turning to FIGS. 3 and 4, a top view of a section or level of multi-layer transmission line structure is shown. To this end, the signal lines are shown at 301 and ground lines 302 having vias 303 for effecting the isolation of the signal line are also shown. The vias shown in FIGS. 3 and 4 at 303, 403 respectively, are holes drilled into the substrates to required depth having metallization therein to effect the proper electrical connection to ground. The vias of the invention of the present disclosure are either plated with a conductor such as gold (and thereby hollow in the center) or are filled with the conductor such as gold (and thereby solid). The material of choice for transmission medium depends on frequency; FR4 is good to 1 GHz and PTFE is suitable for higher frequency application. The via holes in these materials are drilled either mechanically or by laser ablation, and then plated with metal. While the preferred embodiments are drawn to single or multilayer circuit boards, it is entirely possible that the teachings of the present disclosure can be applied to integrated circuits generally to include LSI and VLSI technology. In that event, standard LSI and VLSI processing can be used to effect vias, transmission lines and ground planes. As is discussed herein below, the preferred structure for the via is a cylindrical shape. However, the objects of the present invention can be achieved by fabricating vias having a variety of shapes and orientations to effect the desired inductance level.

As is well known, in adjacent signal line pairs, for example signal lines 102 and 103 in FIG. 1, an electromagnetic wave traveling on one signal line in a given direction, couples electromagnetically to the neighboring signal line. This coupling induces a signal in the direction opposite the transmission direction of the first signal line in a TEM environment, one with a homogeneous dielectric medium. In a medium in which vias are located, as well as other nonhomgeneous dielectric media, forward coupling can be effected, inducing electromagnetic waves in the same direction as the initial signal line. In terms of S parameters, forward coupling would be $S_{31}$ and reverse coupling would be $S_{41}$ in a four port system shown in FIG. 3 with the ports as are shown. With these basic principles in mind, the following discoveries have been made with the respect to the proper placement of vias and the type and placement of ground planes to effect improved isolation in multi-level transmission structures.

An aspect of the present invention is the proper placement of vias with respect to wavelength. For a transmission line of a given wavelength, it has been found that placement of vias at integral half wavelengths apart results in a high Q resonator structure that stores a great deal of energy therein. This energy readily couples to a neighboring transmission line, and reduces the isolation. Accordingly, it is very important to make sure that any and all vias are not located at integral half wavelengths apart. It had been suggested previously that less than a quarter wavelength separation of ground vias is required for improved isolation. This is as disclosed in "SPICE Simulation Used to Characterize Cross-Talk Reduction Effect of Additional Tracks Ground With Vias On Printed Circuit Boards", IEEE Transactions of Circuits and Systems-II Analog and Digital Processing, Vol. 39, No. 6, June 1992. The present invention however reveals that a placement of the vias should in fact be as far apart as possible from one another, however not reaching one half wavelength or multiples thereof in spacing. The only basic exception to this general rule for via placement is discussed herein with regard to the number of vias at a point of transition of a ground plane from one level to another.

The placement of the vias plays a fundamental role in the isolation between signal lines. As stated above, the placement of vias relative to one another on ground planes for signal lines in transmission line structures is generally that they should be placed as far apart as possible without being placed at multiple half wavelengths from one another for the reasons as stated above. For example, in the structure shown in FIG. 3, the distance "D" between vias 303 on ground rail/plane 302 is as close to $n\lambda/2$ as possible but not at $n\lambda/2$. In practice the vias should be spaced a distance D as shown in FIG. 3, where D is in the range $0.8(\lambda/2)$ to $1.2(\lambda/4)$. This spacing of vias applies to all embodiments of the present disclosure except, as discussed at points of transition where many vias are located and are not necessarily spaced at this relation.

Another very important consideration is the placement of vias relative to points of transition. To this end, a point of transition of a ground plane from one level to the next is more properly effected by reducing the inductance of the vias as much as is possible. The placement of one via at the point of a transition of a ground plane from one level to the next results in an undesired inductive effect. This translates into an impedance (reactance) which can be reduced by the placement of multiple vias. Multiple vias near a point of transition are desired so that the effective inductance of the vias is reduced. This is because the effective inductance is approximately inversely proportional to the number of vias and directly proportional to the individual inductance of the vias. So, the two general observations for improving performance in multilayer boards are at a point of transition the vias should be placed in multiple locations about a transition point, as close to the transition point as possible, and with respect to vias on ground planes, the vias should be as far apart as possible, however not at multiple half wavelengths at the wavelength of the signal in the transmission lines.

Another discovery of the present invention is that the particular individual inductance of a given via directly effects the forward coupling. To reduce forward coupling and thereby improve forward isolation, it is important to reduce the individual inductances of the vias. This is accomplished by making the via area greater (such as by increasing the radii of circular vias), as it is well known that inductance reduces rapidly with increasing area. This has beneficial input on manufacturing, as it is easier to fabricate holes for the vias in a circuit board having a greater diameter than those with smaller diameter. Conventional boards use many 8 mil diameter holes.

Figure 5:
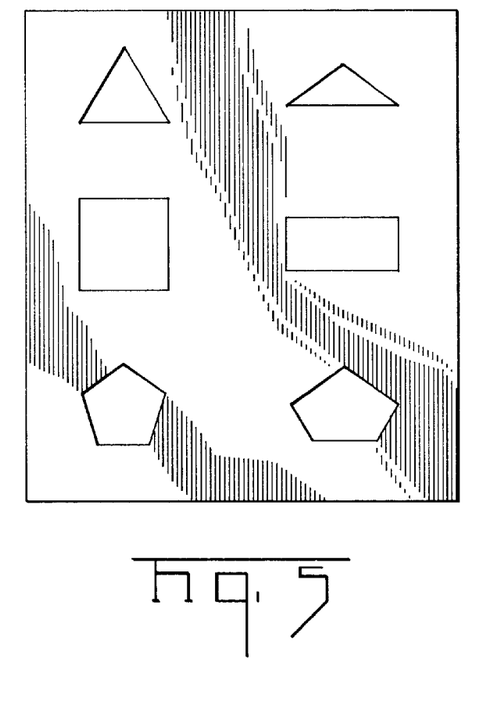
FIGS. 5 and 6 are some of the various shapes of vias of the present invention.
Figure 6:
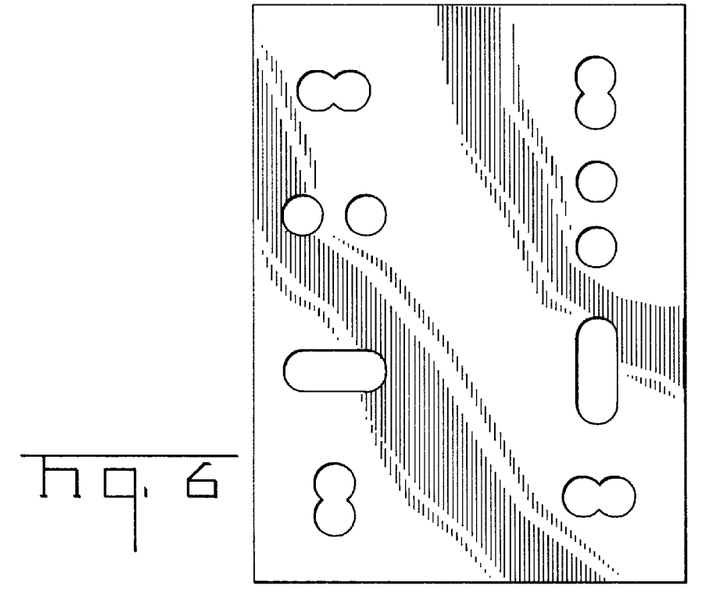

While the preferred embodiment of the present invention envisions a cylindrical via, or a via with a circular cross section, other vias are clearly within the purview of the disclosure of the present invention. For example, the vias could be made of any regular or irregularly shaped polygon as is shown in FIG. 5. If the via is milled using a circular drill bit, an attempt to produce a regular polygon will result in something close to that shape but not identical thereto. Additionally, the shapes of vias as is shown in FIG. 6 are possible as well. In any event, the main thrust of the present disclosure with regard to the shape of the vias is that an increase in area of the individual via and therefore a decrease in inductance and subsequent coupling is desired. This can be achieved by combinations of small vias which can be regular or irregular polygons or the variations of the vias shapes shown in FIGS. 5 and 6 as would be readily apparent to one of ordinary skill in the art. Finally, it is important to note that the orientation of the vias with respect to the transmission line can influence the isolation as well. The via needs to be oriented in such a manner that it can most effectively ground the rf current. Typically for the cross-section in FIG. 1, the EM simulated inductance is 0.006 nH. The present invention, using a 14 mil diameter via results in an inductance of about 0.002 nH, while a 22 mil diameter via results in an inductance less than 0.0002 nH. For 1 GHz application inductance below 0.002 nH, i.e. diameter more than 14 mil may be acceptable.

Accordingly, with respect to vias of neighboring transmission lines, it is imperative to have the vias located as far apart from one another as possible having the cross-sectional area being as large as possible to reduce inductance and yet have the distance between the vias not equal to a half wavelength. Accordingly, it is clear that the vias should be placed as far apart as possible without being at a multiple of a half wavelength.

Figure 7:
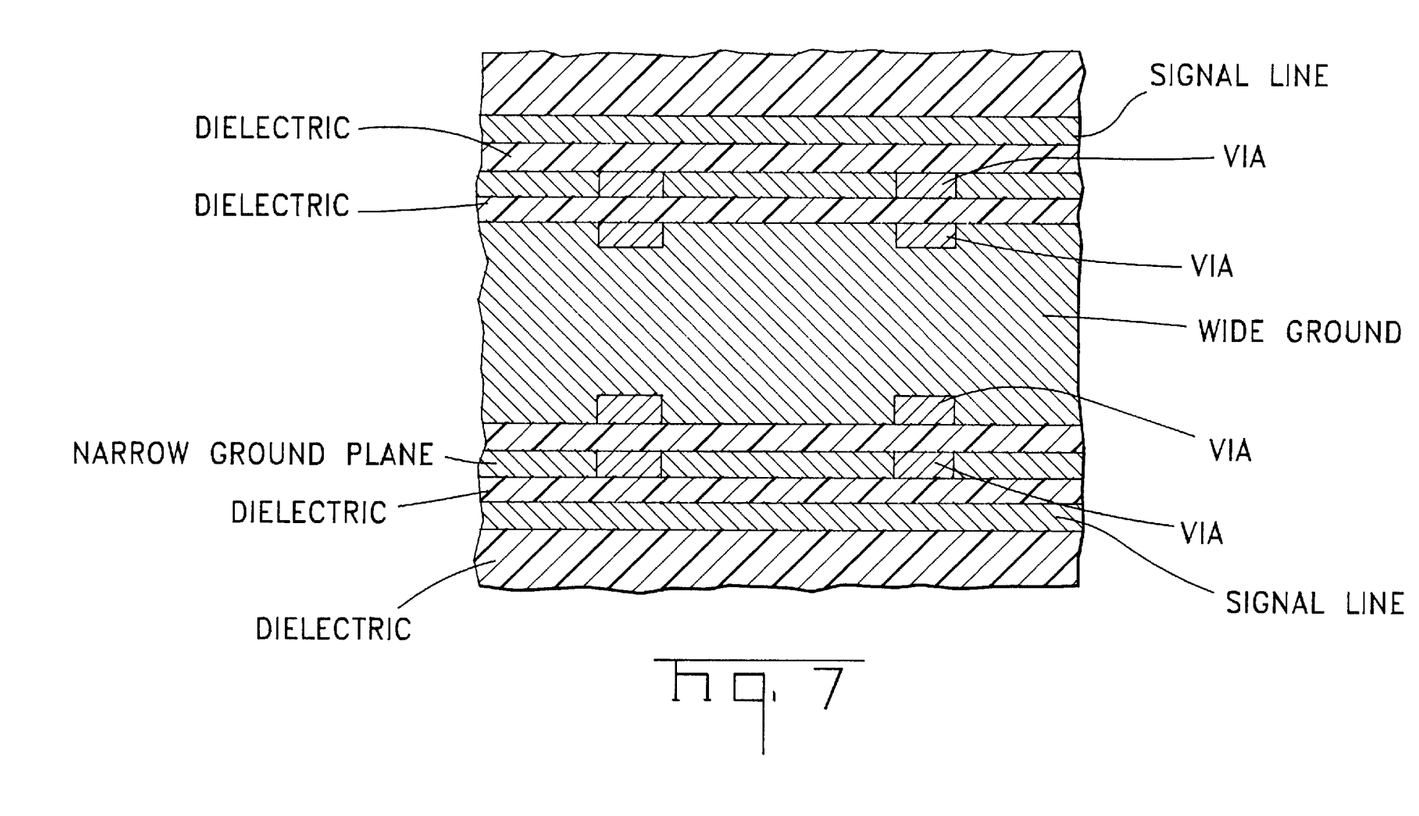
FIG. 7 is a top view of a section of a layer of a multilayer board having a wide ground plane and vias therein and narrow ground planes with the vias therein with the vias being separated as set forth in the disclosure herein for improved isolation.

This principle is illustrated in FIG. 7, which shows a top view of a section of a layer of a multilayer board. Each of the signal lines has a dielectric layer on each side, a narrow ground plane adjacent the dielectric layer, and a wide ground plane, also separated from the narrow ground plane by a dielectric layer. The vias are placed in the wide ground plane and narrow ground planes and are separated as set forth herein for improved isolation.

Figure 8A:
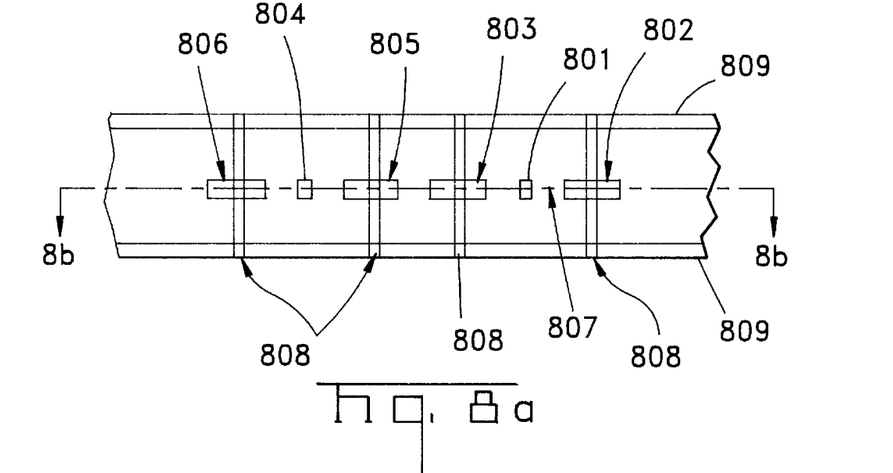
FIG. 8a is a cross-sectional view of an embodiment of the present invention having the two signal line transmission structure shown in FIG. 8b in an intermediate layer of a multilayer printed circuit board.
Figure 8B:
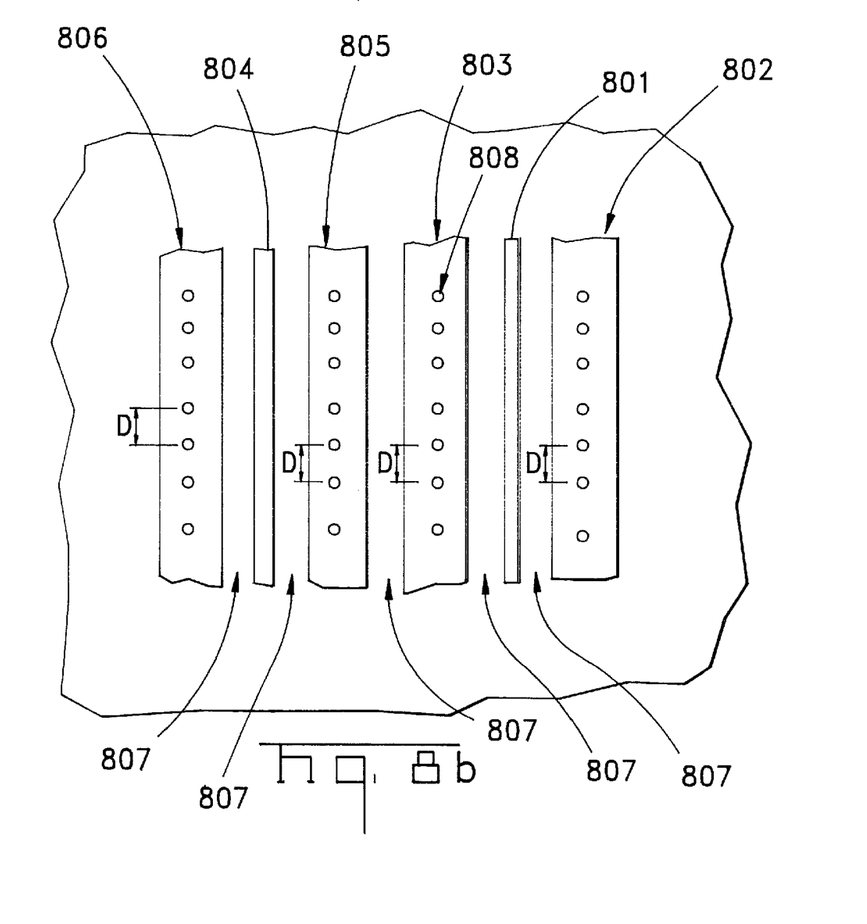
FIG. 8b is a top view of a section of a layer of a multilayer board having two signal lines with ground planes on either side thereof and a section of dielectric between neighboring ground planes of the two signal lines.

Turning to FIGS. 8a and 8b, the preferred embodiment of the present disclosure is shown. A section of one level of a multilayer printed circuit board structure is shown in top view in FIG. 8b. This structure shown in FIG. 8b could be a top layer of a multilayer printed circuit board structure, or alternatively, could be a lower layer with other layers of the multilayer printed circuit board structure disposed above and/or of the layers shown in FIG. 8a. For example, as is shown in FIG. 8a, the transmission line structure shown in FIG. 8b is disposed as an intermediate layer in a dielectric medium 807, with the vias 808 being connected electrically to ground plane at the upper and lower layers of the multilayer structure to achieve the desired electrical ground within the teaching of the present disclosure. In the structure shown in FIGS. 8a and 8b, a signal or transmission line 801 has a ground plane 802 disposed on one side thereof and a second ground plane 803 disposed on another side thereof. The second signal or transmission line 804 has a first ground plane 805 and a second ground plane 806 disposed on either side thereof. In between the transmission lines 801, 804 dielectric material shown generally as 807 is disposed. In the region between the transmission lines for example the transmission line 801 and the ground planes 802 and 803, this layer of material 807 serves as the dielectric for the wave guide. The structure shown in FIG. 8b is a coplanar wave guide structure in the present invention with the exception that there can be a ground plane above and below the structure (as shown in FIG. 8a) with the ground vias extending through to these layers. In essence this forms a pseudo-suspended stripline structure with high isolation between the signal lines. The dielectric material 807 between the ground plane 805 and the ground plane 803 serves to separate the ground planes 805 and 803 and improves isolation.

The vias shown generally at 808 are disposed along the ground planes and serve to reduce the potential of the electrical ground level. These are connected to other ground planes on other levels (for example as shown at 809 in FIG. 8a) or layers of the multilayer printed circuit board. As discussed above, it is of critical importance to maintain a good electrical ground so that isolation between transmission lines both at the same layer of the multilayer transmission line structure as well as isolation of transmission lines in different layers of the multilayer transmission board structure and finally at points of transition is maintained at an acceptable level. By maintaining a good electrical ground, as well as by virtue of the structure shown in FIG. 8b, electromagnetic field lines are terminated on the ground planes, and the likelihood of inducing electromagnetic signals from one transmission line to the neighboring transmission line is significantly reduced. Finally, the distance between the vias 808 as well as their shape and size is the same as is discussed above. To this end, the diameter of the vias is on the order of 10–22 mils, and the spacing between vias is in the range of 0.8 ($\lambda/2$) to 1.2 ($\lambda/4$) (again shown as "D" in FIG. 8b) at the wavelength ($\lambda$) of the electromagnetic wave in the dielectric medium of the multilayer transmission line structure.

Figure 9:
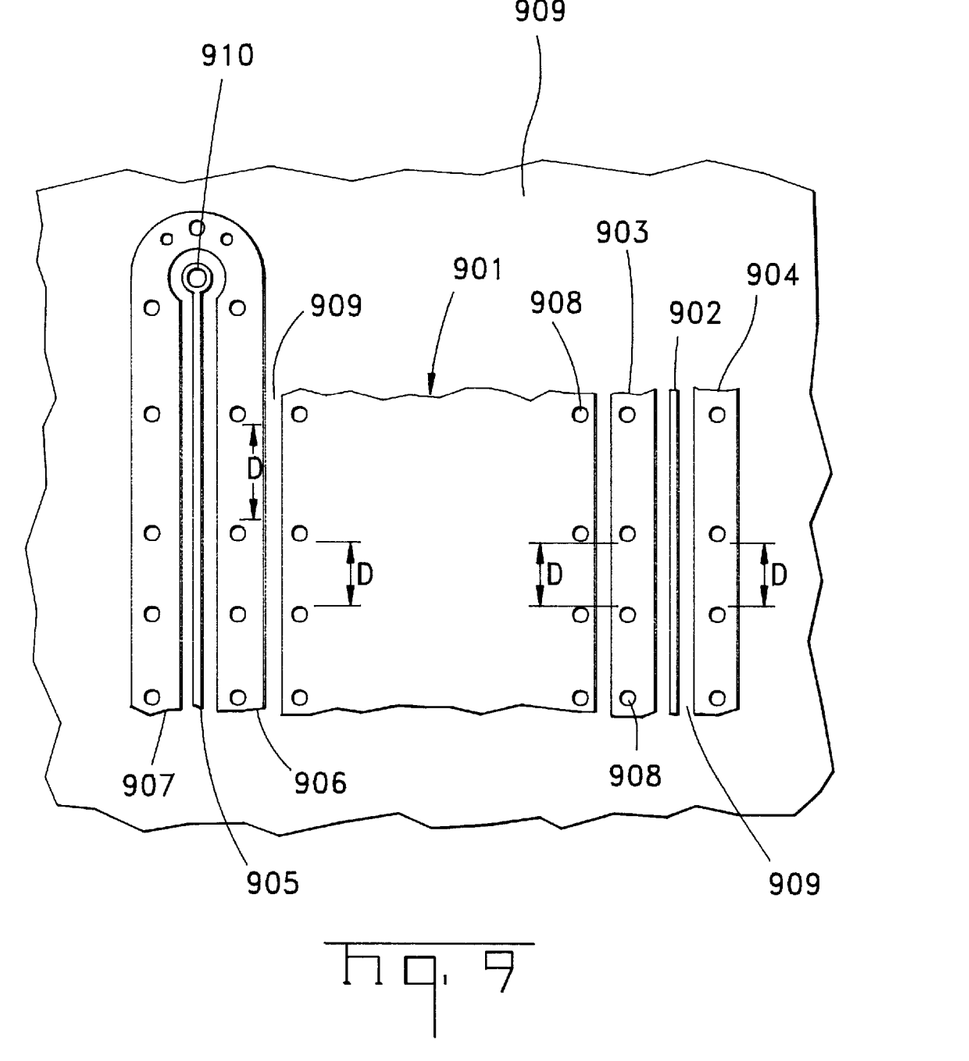
FIG. 9 is a top view of a section of a layer of a multilayer board with the two transmission line structure of FIG. 8b having a ground fill layer between the coplanar waveguide structure of the transmission lines.

Turning to FIG. 9, an alternative arrangement is shown wherein a ground fill layer shown at 901 is disposed between the transmission line structure with the signal or transmission line 902 having the ground planes 903 and 904 and the signal or transmission line 905 having ground planes 906 and 907 respectively. The vias shown at 908 also are of the same dimension, shape and are spaced preferably in the range 0.8 ($\lambda/2$) to 1.2 ($\lambda/4$), where $\lambda$ is the wavelength of the electromagnetic wave in the dielectric medium (again the spacing is shown as "D" in FIG. 9). The dielectric material is shown at 909 and functions in the manner discussed above between the transmission line, for example 905, and the respective ground planes 906 and 907. An additional gap in which dielectric material is disposed, and again, functions to separate the ground planes 906 and 903 from the ground fill 901. This ground fill layer functions as a further termination point for electromagnetic field lines so that the isolation between the transmission lines 905 and 902 is maintained. The vias on the ground fill as well as on the ground planes are shown at 908, and are spaced at intervals as discussed above. Again, the diameters and shapes of the vias are also as discussed above. This ground fill layer 901 functions not only as a further ground plane for termination of electromagnetic field lines and thereby proper isolation of the field lines at the same layer of the multilayer transmission line structure, but also as a ground plane for transmission lines on other layers of the multilayer transmission line structure (not shown). To this end, the structure shown in FIG. 9 is one layer of a multilayer printed circuit board structure. Disposed on top of this layer, for example is a layer of dielectric material and disposed on top of this dielectric material are further transmission lines within the keeping of the teaching of the present invention. The ground fill 901 would serve possibly as a ground plane for the transmission lines disposed on top of the dielectric material. Finally, a transition point for the signal or transmission line 905 from the layer shown in FIG. 9 to another layer (above or below) is shown at 910. The vias are more numerous and more closely spaced for reasons discussed above.

The invention having been described in detail, it is clear that the application of the present invention to other structures is certainly possible. To the extent that the placement of ground vias at other than multiple half wavelengths and in a reduced density as well as in segment lengths to avoid phase coupling are utilized in order to reduce isolation in multilevel rf and other high frequency structures, such are deemed within the purview of the present invention.

We claim:

1. transmission line structure for propagating an electromagnetic wave hang a wave length $\lambda$ in a dielectric medium comprising:

a first signal line having first and second sides, said first signal line being substantially coplanar with first and second ground planes, said first ground plane being adjacent said first side of said first signal line and said second ground plane being adjacent said second side of said first signal line;

a second signal line substantially coplanar with said first signal line, having first and second sides;

a third ground plane adjacent said first side of said second signal line and a fourth ground plane adjacent said second side of said second signal line, said second signal line being substantially coplanar with said third and fourth ground planes; and vias disposed in said ground planes, said vias being separated along the length of said ground planes by a distance in the range of approximately $0.8(\lambda/2)$ to $1.2(\lambda/4)$.

2. A transmission line structure as recited in claim 1 wherein said transmission line structure is one layer of a multilayer transmission line structure and said vias connect said ground planes to at least one ground plane on another layer of said multilayer transmission line structure.

3. A transmission line structure as recited in claim 1 wherein said first signal line and said second signal line are electrically isolated from one another on the order of 60–85 dB.

4. A transmission line structure as recited in claim 1 wherein said vias are substantially cylindrical and have a diameter on the order of 14–22 mils.

5. A transmission line structure as recited in claim 1 wherein said vias have a diameter in the range of 10 mils–22 mils.

6. A transmission line structure for propagating an electromagnetic wave having a wave length $\lambda$ and a dielectric medium, comprising: p1 a first signal line having first and second sides, said first signal line having a first ground plane disposed on said first side and a second plane disposed on said second side of said first signal line;

a ground fill layer disposed adjacent and second ground plane of said first signal line;

a second signal line having a first side and a second side, said second signal line having a first ground plane on said first side and a second ground plane on said second side, said second ground plane of said second signal line being adjacent said ground fill layer, wherein said first signal line, said second signal line, said ground fill layer and said ground planes are substantially coplanar.

7. A transmission line structure as recited in claim 6 wherein vias are disposed in said ground fill layer and said ground layers, said vias being separated along the length of the ground planes by a distance in the range of 0.8 $(\lambda/2)$ to $1.2(\lambda/4)$.

8. A transmission line structure as recited in claim 7 wherein said transmission line structure is one layer of a multilayer transmission line structure and said vias electrically connect said ground planes and said ground fill layer to at least one ground plane on another layer of said multilayer transmission line structure.

* * * * *